(12) United States Patent
Tetelbaum

(10) Patent No.: US 6,543,038 B1
(45) Date of Patent: Apr. 1, 2003

(54) ELMORE MODEL ENHANCEMENT

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 85 days.

(21) Appl. No.: 09/771,272

(22) Filed: Jan. 26, 2001

(51) Int. Cl.$^7$ ............................................... G06F 17/50
(52) U.S. Cl. .................... 716/6; 716/4; 716/5
(58) Field of Search .................... 716/6, 5, 4

(56) References Cited

U.S. PATENT DOCUMENTS 6,473,890 B1 * 10/2002 Yasui et al. .................... 716/10

OTHER PUBLICATIONS

Tsay, "An Exact Zero–Skew Clock Routing Algorithm", IEEE, 1993.*
Chao et al. "Zero Skew Routing with Minimum Wirelength", IEEE, 1992.*
Yoda et al, "Clock Scheduling with Consideration of Modification Cost in Semi–Syncronous Circuit.", Technical Report of Institute of Electronics, Information and Communication Engineers, CAS99–36, pp. 45–52. 1999.*

* cited by examiner

Primary Examiner—Vuthe Siek
Assistant Examiner—Brandon Bowers
(74) Attorney, Agent, or Firm—Trexler, Bushnell, Giangiorgi, Blackstone & Marr, Ltd.

(57) ABSTRACT

A method for calculating skew associated with providing a signal to a capacitive load along a first and second wire. The method includes steps of calculating a skew error which would result if the Elmore Model were used to calculate delays using the actual length of the wires, calculating a new effective length for the second wire based on the error which has been calculated, using the Elmore Model to calculate an effective delay which would be associated with providing the signal to the capacitive load along the new effective length of wire, and calculating skew using the effective delay which has been calculated. Preferably, the new effective length for the second wire is calculated by considering the actual lengths of the first and second wires, the capacitance of a unit length of wire and the capacitance of the capacitive load.

16 Claims, 4 Drawing Sheets

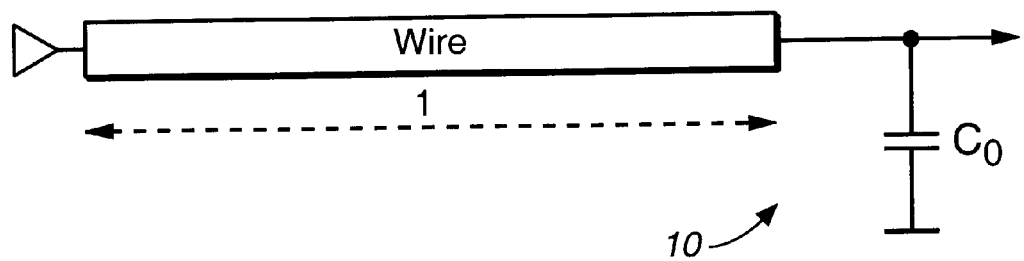
FIG._1
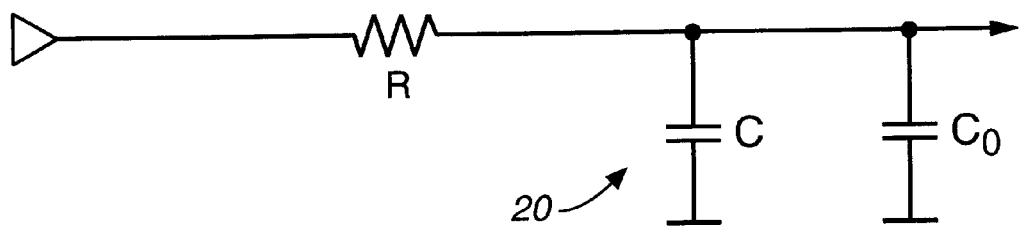
FIG._2
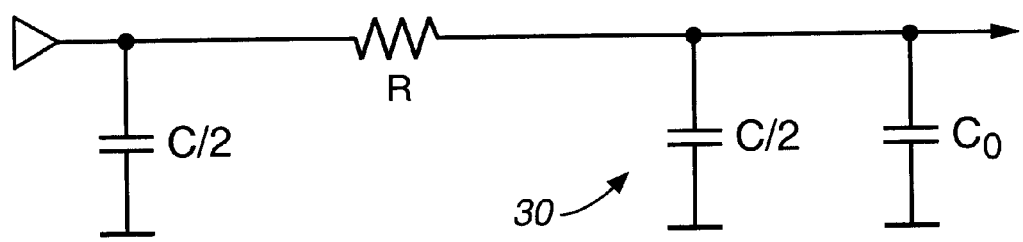
FIG._3

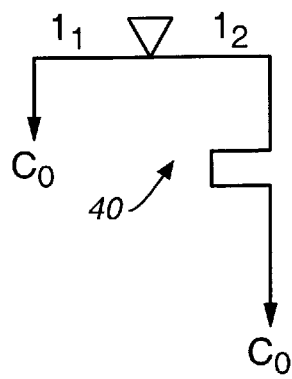
FIG._4
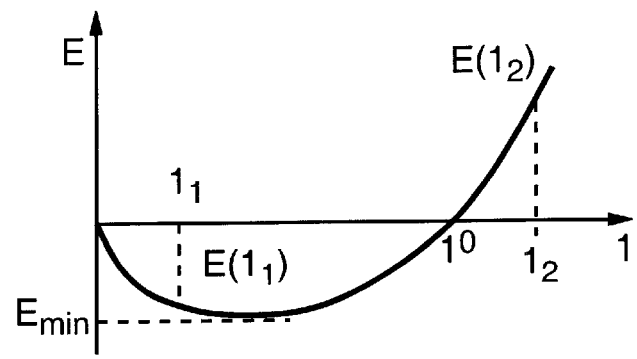
FIG._5
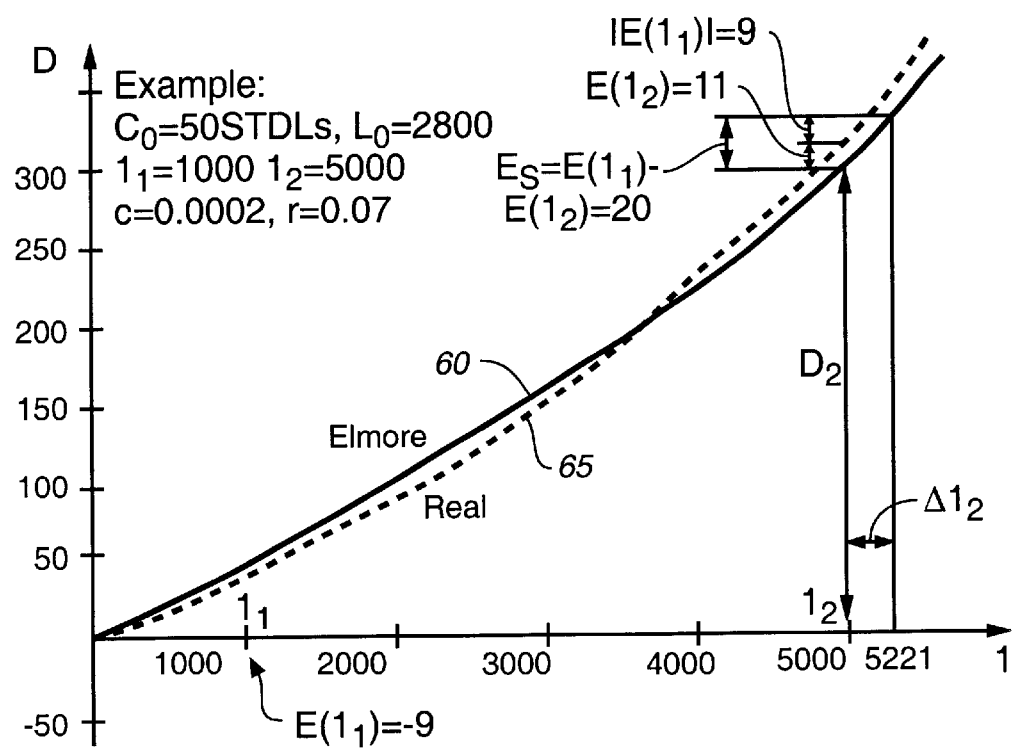
FIG._6

| Conditions | Skew Error | Comment |
|---|---|---|
| $1_1 = 1_2$ <br> (graph showing $1_1=1_2$ on curve) | 0 | Best case: <br> No correction <br> $E(1_1) = E(1_2)$ |
| $1_1 < 1_2 < 1_m < 1^0$ <br> (graph showing $1_1\ 1_2\ 1_m$ on curve) | $0 < E_S \le |E_{min}|$ <br> $E_S = |E(1_2)| - |E(1_1)|$ | Limited error <br> Partial compensation <br> $E(1_1) < 0$ <br> $E(1_2) < 0$ |
| $1_1 < 1_m < 1_2 < 1^0$ <br> (graph showing $1_1\ 1_m\ 1_2$ on curve) | $|E_S| \le |E_{min}|$ <br> $E_S > 0$ or $E_S < 0$ <br> $E_S = E(1_1) - E(1_2)$ | Limited error <br> Partial compensation <br> $E(1_1) < 0$ <br> $E(1_2) < 0$ |
| $1_m < 1_1 < 1_2 < 1^0$ <br> (graph showing $1_m\ 1_1\ 1_2$ on curve) | $E_S < 0$ <br> $|E_S| \le |E_{min}|$ <br> $E_S = -(|E(1_1)| - |E(1_2)|)$ | Limited error <br> Partial compensation <br> $E(1_1) < 0$ <br> $E(1_2) < 0$ |
| $1_1 < 1^0 < 1_2$ <br> (graph showing $1_1$, $1^0$, $1_2$ on curve) | $E_S < 0$ <br> $E_S = -(|E(1_1)| + |E(1_2)|)$ | Possible big values <br> $E(1_1) < 0$ <br> $E(1_2) < 0$ |

*FIG._7*

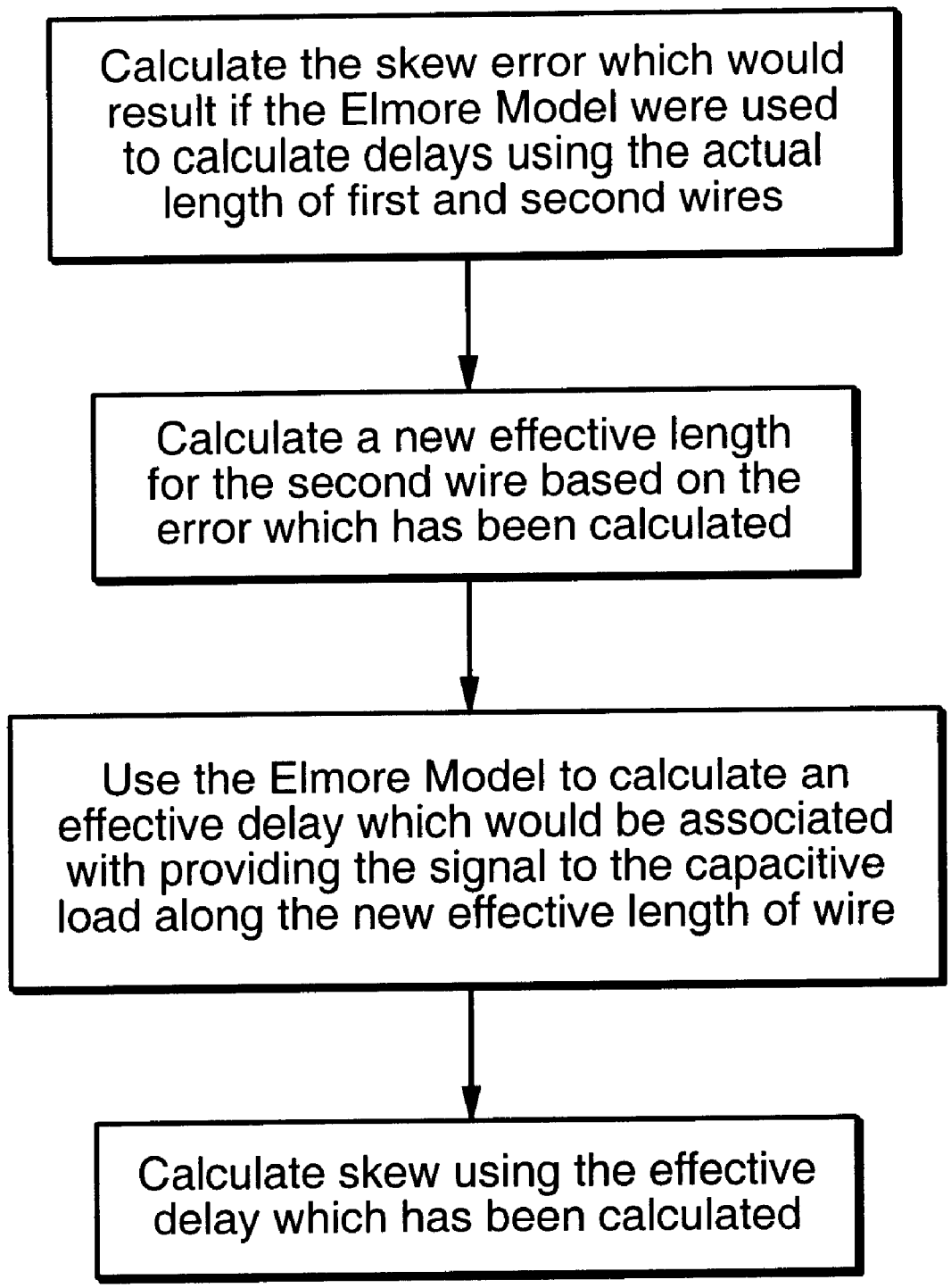
FIG._8

ELMORE MODEL ENHANCEMENT

BACKGROUND

This invention generally relates to the Elmore Model, and more specifically relates to an enhancement to the Elmore Model so that wire delays can be more accurately estimated.

The Elmore Model is a mathematical model which is used to estimate the delays at tapping points along a RC line. In other words, it is a tool for estimating the delay associated with providing a signal over a wire to a capacitive load. The Elmore Model is widely used in circuit design. For example, the Elmore Model is widely used during construction of a balanced clock tree (BCT) at different levels of clock net partition. The Elmore Model is described in several publications. For example, see W. C. Elmore, "The transient response of damped linear networks with particular regard to wide-band amplifier", J Applied Physics, Vol. 19, no. 1, pp. 55–63, January 1948. Generally, one having ordinary skill the art is very familiar with the Elmore Model.

While the Elmore Model is a helpful model to use for wire delay estimations, the Elmore Model is not perfect, and very often introduces some error. In other words, the actual or real delay is often different than the delay as calculated using the Elmore Model. This error may be compounded when attempting to calculate skew using the Elmore Model, where one delay calculation is compared to another. Obviously, if the Elmore Model were to be improved or enhanced, estimations using the Elmore Model would be more accurate. This would improve designs. For example, if the Elmore Model were to be improved or enhanced, clock skew can be minimized among partition groups in a balanced clock tree (BCT).

OBJECTS AND SUMMARY

A general object of an embodiment of the present invention is to provide an enhancement to the Elmore Model.

Another object of an embodiment of the present invention is to counter or compensate for errors which would otherwise be introduced using the Elmore Model.

Still another object of an embodiment of the present invention is to provide a method of more accurately estimating delays using the Elmore Model.

Briefly, and in accordance with at least one of the foregoing objects, an embodiment of the present invention provides a method for calculating skew associated with providing a signal to a capacitive load along a first and second wire. The method includes steps of calculating a skew error which would result if the Elmore Model were used to calculate delays using the actual length of the wires, calculating a new effective length for the second wire based on the error which has been calculated, using the Elmore Model to calculate an effective delay which would be associated with providing the signal to the capacitive load along the new effective length of wire, and calculating skew using the effective delay which has been calculated. Preferably, the new effective length for the second wire is calculated by considering the actual lengths of the first and second wires, the capacitance of a unit length of wire and the capacitance of the capacitive load. More specifically, preferably the following formula is used:

$$\Delta l_2 = -(L_o/2 + l_2) + (L_o^2/4 + 1.4l_2^2 + 0.4L_o l_2 - 0.4l_1^2 + 0.6L_o l_1)^{1/2}$$

wherein $\Delta l_2$ is an amount added to the actual length of the second wire to arrive at the new effective length, $L_o$ is the capacitance of the capacitive load divided by the capacitance of a unit length of wire, $l_1$ is the actual length of the first wire, and $l_2$ is the actual length of the second wire.

The method can be used, for example, to minimize clock skew among partition groups in a balanced clock tree (BCT).

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic view of a representative arrangement where a length (l) of wire is used to supply a signal to a capacitive load ($C_o$);

FIG. 2 is an RC model of that which is shown in FIG. 1;

FIG. 3 is an Elmore Model circuit based on that which is shown in FIGS. 1 and 2;

FIG. 4 is a schematic diagram showing a signal being provided along two wires ($l_1$ and $l_2$) to a capacitive load (Co);

FIG. 5 is a graph showing wire length (l) plotted against error (E) associated with estimating the delay using the Elmore Model;

FIG. 6 is a graph showing wire length (horizontal axis) plotted against delay (vertical axis)—both Real and according to the Elmore Model;

FIG. 7 shows a table summarizing different cases and estimations for skew error; and FIG. 8 is a block diagram illustrating a method which is in accordance with an embodiment of the present invention.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

An embodiment of the present invention provides an enhancement to the Elmore Model. Specifically, a method of calculating skew is provided wherein an enhancement to the Elmore Model is used. The enhancement compensates for errors which would otherwise be introduced using the Elmore Model. As a result of using the enhancement, delays can be more accurately estimated. As will be described, the enhancement provides that a new effective length of wire is used in the Elmore Model to provide a more accurate calculation of skew. The new effective length is calculated by considering the actual lengths of the wires, the capacitance of a unit length of wire, and the capacitance of the capacitive load. The enhancement can used with the Elmore Model, for example, to minimize clock skew among partition groups in a balanced clock tree (BCT).

FIG. 1 depicts a representative arrangement 10 where a length (l) of wire is used to supply a signal to a capacitive load ($C_o$). An RC Model 20 of the arrangement is shown in FIG. 2. The real theoretical delay for this RC circuit is:

$$D_{Real} = RCln2 = 0.7RC \text{ or} \tag{1}$$

$$D_{Real} = 0.7rl(cl + C_o) \text{ or} \tag{2}$$

$$D_{Real} = 0.7rcl(1 + L_o)$$

where r is the resistance and c is the capacitance of a unit length of wire, and $L_o=C_o/c$.

Illustrated in FIG. 3 is the Elmore Model equivalent 30 of that which is shown in FIGS. 1 and 2. Mathematically applying the Elmore Model to that which is shown in FIG. 3 provides:

$$D_{Elmore-R}(C/2+C_o) \text{ or} \tag{4}$$

$$D_{Elmore}=0.5rcl(l+L_o). \tag{5}$$

The error in delay E(l) for the Elmore Model is effectively the difference between equations 3 and 5, or:

$$E(l)=D_{Real}-D_{Elmore} \text{ or} \tag{6}$$

$$E(l)=rcl(0.2\ l-0.3L_o). \tag{7}$$

The point (i.e. wire length) at which the error (E(l)) is zero will be referred to as $l^0$ (see, for example FIG. 5). So:

$$E(l=l^0)=0 \text{ when } 0.2\ l^0-0.3\ L_o=0, \text{ or when} \tag{8}$$

$$l^0=3L_o/2. \tag{9}$$

FIG. 4 shows an arrangement 40 where a signal is being provided to a capacitive load ($C_o$) along two wires ($l_1$ and $l_2$) of different lengths. The clock skew error ($E_s$) which results from using the Elmore Model to calculate the delays along wires $l_1$ and $l_2$ is as follows:

$$E_s(l_1, l_2)=E(l_1)-E(l_2) \tag{10}$$

$$=rc\{l_1(0.2\ l_1-0.3L_o)-l_2(0.2\ l_2-0.3L_o)\} \tag{11}$$

$$=rc\{0.2\ l_1^2-0.3L_o l_1-0.2\ l_2^2+0.3L_o l_2)\} \tag{12}$$

$$=rc\{-0.2(l_2^2-l_1^2)+0.3L_o(l_2-l_1)\} \tag{13}$$

$$=rc(l_2-l_1)\{0.3L_o-0.2(l_2+l_1)\}. \tag{14}$$

Therefore, minimization of the absolute value of $l_1-l_2$ (i.e. the closer in length the two wires are) minimizes skew.

FIG. 5 graphs the error (E) associated with using the Elmore Model to calculate delay as a function of wire length (l). As shown, while the error (E($l_1$)) associated with using the Elmore Model to estimate delay can be negative (i.e., the Elmore Model overestimates the delay) for one wire length ($l_1$), the error (E($l_2$)) associated with using the Elmore Model to estimate delay can be positive (i.e., the Elmore Model underestimates the delay), for another wire length ($l_2$). As shown in FIG. 5 (and discussed hereinabove), $l^0$ designates the point (i.e., wire length) at which using the Elmore Model to calculate delay results in no error. $E_{min}$ designates the most negative the delay error can be when using the Elmore Model to calculate delay.

To account for the error which would result from using the Elmore Model to estimate delays (see generally equation 6) and thereafter using the estimations to calculate skew (see generally equation 10) and possibly compounding the error, an embodiment of the present invention provides that a length of one of the wires, for example $l_2$, is effectively changed to provide more accurate calculations using the Elmore Model.

Assuming that $l_1<l_2$:

$$\text{if } E_s(l_1, l_2)>0 \ \{i.e., E(l_1) \text{ is greater than } E(l_2)\}, \tag{15}$$

then $l_2$ should be (effectively) decreased (or $l_1$ increased, which is usually not desirable) to provide a more accurate skew calculation, $$\text{if } E_s(l_1, l_2)<0 \ \{i.e., E(l_2) \text{ is greater than } E(l_1)\} \tag{16}$$

then $l_2$ should be (effectively) increased (or $l_1$ decreased, which is usually not possible). to provide a more accurate skew calculation. Letting $\Delta l_2$ be the change in $l_2$ such that:

$$D_{Elmore}(l_2)-D_{Elmore}(l_2+\Delta l_2)=E_s(l_1, l_2), \tag{17}$$

then the skew error (as a result of using the Elmore Model to calculate the delays associated with $l_1$ and $l_2+\Delta l_2$) would be zero.

Applying equation 5 to equation 17:

$$0.5rc\{l_2(l_2+L_o)-(l_2+\Delta l_2)(l_2+\Delta l_2+L_o)\}=E_s \tag{18}$$

Then the correction of $l_2$ is:

$$\Delta l_2=-(L_o/2+l_2)+\text{Sqrt}(L_o^2/4+l_2^2+L_o l_2-2E_s/rc) \tag{19}$$

$$=-(L_o/2+l_2)+\text{Sqrt}(L_o^2/4+1.4l_2^2+0.4L_o l_2-0.4l_1^2+0.6L_o l_1) \tag{20}$$

resulting in new length $l_2=l_2+\Delta l_2$

The errors associated with using the Elmore Model to estimate delays is illustrated graphically in FIG. 6. In the graph shown in FIG. 6, delay (D) is plotted against wire length (l). The delay as calculated using the Elmore Model is plotted in solid line 60, while the real delay is plotted in dashed line 65. Obviously, the difference (i.e. space) between the two lines corresponds to error and generally relates to equation 6. As shown, the error differs depending on the wire length. The point at which the two lines cross (at about l=3700) is effectively $l^0$. As shown, at lengths less than $l^0$, the Elmore Model overestimates the delay, and at lengths more than $l^0$, the Elmore Model underestimates the delay.

FIG. 6 plots an example where $C_o=50$ STDLs, $L_o=2800$, $l_1=1000$, $l_2=5000$, c=0.0002 and r=0.07. In the example shown, the error resulting from using the Elmore Model to estimate the delay associated with $l_1$ is −9 (i.e. E($l_1$)=$D_{Real}-D_{Elmore}=-9$), and the error resulting from using the Elmore Model to estimate the delay associated with $l_2$ is $l_1$ (i.e. E($l_2$)=$D_{Real}-D_{Elmore}=11$). SO the error resulting from using the Elmore Model to estimate skew is −20 (i.e. $E_s=$E($l_1$)−E($l_2$)=−20). Since, the skew error is the difference between the error associated with using the Elmore Model to estimate the delay associated with $l_1$ minus the error associated with using the Elmore Model to estimate the delay associated with $l_2$, skew error can be reduced to zero is the error is anticipated and a different effective length of $l_2$ is chosen such that E($l_1$)−E($l_2$)=0. In the example shown in FIG. 6, if the new effective length of $l_2$ is chosen to be 5221 (i.e. $\Delta l_2=221$), the skew error will be zero.

FIG. 7 shows a table summarizing different cases and estimations for skew error. In the table, $l_m$ is the wire length which corresponds to $E_{min}$ (see FIG. 5). In FIG. 7, "partial compensation" means that when skew is calculated, the error resulting from using the Elmore Model to estimate the delays is mathematically decreased as a result of combining the delay estimates to arrive at a skew calculation.

The above-described method is graphically represented in FIG. 8. As shown, the method includes steps of calculating a skew error which would result if the Elmore Model were used to calculate delays using the actual length of first and second wires, calculating a new effective length for the second wire based on the error which has been calculated, using the Elmore Model to calculate an effective delay which would be associated with providing the signal to the capacitive load along the new effective length of wire, and calculating skew using the effective delay which has been calculated. Preferably, the new effective length for the second wire is calculated by considering the actual lengths of the first and second wires, the capacitance of a unit length of wire and the capacitance of the capacitive load. More specifically, preferably the following formula (equation 20 above) is used:

$$\Delta l_2 = -(L_o/2 + l_2) + (L_o^2/4 + 1.4 l_2^2 + 0.4 L_o l_2 - 0.4 l_1^2 + 0.6 L_o l_1)^{1/2}$$

wherein $\Delta l_2$ is an amount added to the actual length of the second wire to arrive at the new effective length, $L_o$ is the capacitance of the capacitive load divided by the capacitance of a unit length of wire, $l_1$ is the actual length of the first wire, and $l_2$ is the actual length of the second wire.

The method can be used to improve the accuracy of clock delay and skew estimations. Ideally, the method will lead to increased system performance and improve design quality. The method can be used, for example, to minimize clock skew among partition groups in a balanced clock tree (BCT).

While an embodiment of the present invention is shown and described, it is envisioned that those skilled in the art may devise various modifications of the present invention without departing from the spirit and scope of the appended claims.

What is claimed is:

1. A method for calculating skew associated with providing a signal to a capacitive load along first and second wires comprising: calculating a skew error which would result if Elmore Models were used to calculate delays using the actual length of the first and second wires; calculating a new effective length for the second wire based on the error which has been calculated; using the Elmore Model to calculate an effective delay which would be associated with providing the signal to the capacitive load along the new effective length of wire; and calculating skew using the effective delay which has been calculated.

2. A method as recited in claim 1, further comprising calculating the new effective length for the second wire by considering the actual length of the first wire.

3. A method as recited in claim 1, further comprising calculating the new effective length for the second wire by considering the actual length of the second wire.

4. A method as recited in claim 1, further comprising calculating the new effective length for the second wire by considering the actual lengths of the first and second wires.

5. A method as recited in claim 1, further comprising calculating the new effective length for the second wire by considering the capacitance of a unit length of wire.

6. A method as recited in claim 1, further comprising calculating the new effective length for the second wire by considering the capacitance of the capacitive load.

7. A method as recited in claim 1, further comprising calculating the new effective length for the second wire by considering the actual lengths of the first and second wires, the capacitance of a unit length of wire and the capacitance of the capacitive load.

8. A method for calculating skew associated with providing a signal to a capacitive load along first and second wires, comprising:

calculating a skew error which would result if Elmore Models were used to calculate delays using the actual length of the first and second wires;

calculating a new effective length for the second wire based on the error which has been calculated;

using the Elmore Model to calculate an effective delay which would be associated with providing the signal to the capacitive load along the new effective length of wire;

calculating skew using the effective delay which has been calculated; and wherein the new effective length of the second wire is calculated using the following formula;

$$\Delta l_2 = -(L_o/2 + l_2) + (L_o^2/4 + 1.4 l_2^2 + 0.4 L_o l_2 - 0.4 l_1^2 + 0.6 L_o l_1)^{1/2}$$

wherein $\Delta l_2$ is an amount added to the actual length of the second wire to arrive at the new effective length;

$L_o$ is the capacitance of the capacitive load divided by the capacitance of a unit length of wire;

$l_1$ is the actual length of the first wire; and $l_2$ is the actual length of the second wire.

9. A method for minimizing clock skew among partition groups in a balanced clock tree by calculating skew associated with providing a signal to a capacitive load along first and second wires, said method comprising: calculating a skew error which would result if Elmore Models were used to calculate delays using the actual length of the first and second wires; calculating a new effective length for the second wire based on the error which has been calculated; using the Elmore Model to calculate an effective delay which would be associated with providing the signal to the capacitive load along the new effective length of wire; calculating skew using the effective delay which has been calculated; and designing the balanced clock tree based on the skew which has been calculated.

10. A method as recited in claim 9, further comprising calculating the new effective length for the second wire by considering the actual length of the first wire.

11. A method as recited in claim 9, further comprising calculating the new effective length for the second wire by considering the actual length of the second wire.

12. A method as recited in claim 9, further comprising calculating the new effective length for the second wire by considering the actual lengths of the first and second wires.

13. A method as recited in claim 9, further comprising calculating the new effective length for the second wire by considering the capacitance of a unit length of wire.

14. A method as recited in claim 9, further comprising calculating the new effective length for the second wire by considering the capacitance of the capacitive load.

15. A method as recited in claim 9, further comprising calculating the new effective length for the second wire by considering the actual lengths of the first and second wires, the capacitance of a unit length of wire and the capacitance of the capacitive load.

16. A method for minimizing clock skew among partition groups in a balanced clock tree by calculating skew associated with providing a signal to a capacitive load along first and second wires, said method comprising:

calculating a skew error which would result if Elmore Models were used to calculate delays using the actual length of the first and second wires;

calculating a new effective length for the second wire based on the error which has been calculated;

using the Elmore Model to calculate an effective delay which would be associated with providing the signal to the capacitive load along the new effective length of wire;

calculating skew using the effective delay which has been calculated;

designing the balanced clock tree based on the skew which has been calculated; and wherein said new effective length of the second wire is calculated using the following formula;

$$\Delta l_2 = -(L_o/2 + l_2) + (L_o^2/4 + 1.4 l_2^2 + 0.4 L_o l_2 - 0.4 l_1^2 + 0.6 L_o l_1)^{1/2}$$

wherein $\Delta l_2$ is an amount added to the actual length of the second wire to arrive at the new effective length;

$L_o$ is the capacitance of the capacitive load divided by the capacitance of a unit length of wire;

$l_1$ is the actual length of the first wire; and $l_2$ is the actual length of the second wire.

* * * * *